(12) United States Patent
Kuan et al.

(10) Patent No.: US 9,543,270 B1
(45) Date of Patent: Jan. 10, 2017

(54) MULTI-DEVICE PACKAGE AND MANUFACTURING METHOD THEREOF

(71) Applicant: Inotera Memories, Inc., Taoyuan (TW)

(72) Inventors: Shih-Fan Kuan, Taoyuan (TW); Yi-Jen Lo, New Taipei (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 14/814,524

(22) Filed: Jul. 31, 2015

(51) Int. Cl.
  *H01L 25/04* (2014.01)
  *H01L 25/065* (2006.01)
  *H01L 23/00* (2006.01)
  *H01L 23/538* (2006.01)
  *H01L 23/31* (2006.01)
  *H01L 23/522* (2006.01)
  (Continued)

(52) U.S. Cl.
  CPC ........... *H01L 25/0652* (2013.01); *H01L 21/52* (2013.01); *H01L 21/565* (2013.01); *H01L 21/76802* (2013.01); *H01L 21/76879* (2013.01); *H01L 21/823475* (2013.01); *H01L 23/3114* (2013.01); *H01L 23/5226* (2013.01); *H01L 23/5384* (2013.01); *H01L 23/5386* (2013.01); *H01L 24/03* (2013.01); *H01L 24/09* (2013.01); *H01L 25/0657* (2013.01); *H01L 25/50* (2013.01); *H01L 2224/02317* (2013.01); *H01L 2224/02372* (2013.01); *H01L 2224/02373* (2013.01); *H01L 2224/0401* (2013.01); *H01L 2224/08165* (2013.01); *H01L 2224/08235* (2013.01); *H01L 2224/08238* (2013.01); *H01L 2225/06517* (2013.01); *H01L 2225/06541* (2013.01); *H01L 2225/06548* (2013.01); *H01L 2924/1434* (2013.01)

(58) Field of Classification Search
  CPC .. H01L 25/0652; H01L 25/0657; H01L 25/50; H01L 21/52; H01L 21/565; H01L 21/76802; H01L 21/76879; H01L 21/823475; H01L 23/3114; H01L 23/5226; H01L 23/5384; H01L 23/5386; H01L 24/03; H01L 24/09
  See application file for complete search history.

(56) References Cited

U.S. PATENT DOCUMENTS 7,061,122 B2   6/2006  Kim et al.
2015/0162308 A1* 6/2015 Kraft ................ H01L 23/49838
                                                       257/676

FOREIGN PATENT DOCUMENTS

TW   201216426 A   4/2012
TW   201431019 A   8/2014
(Continued)

*Primary Examiner* — Daniel Shook
(74) *Attorney, Agent, or Firm* — CKC & Partners Co., Ltd.

(57) ABSTRACT

A multi-device package includes a substrate, at least two device regions, a first redistribution layer, an external chip, a plurality of first connectors and a conductive contact. The two device regions are formed from the substrate, and the substrate has a first surface and a second surface opposite to the first surface. The first redistribution layer is disposed on the first surface and electrically connected to the two device regions, and the external chip is disposed on the first redistribution layer. The first connectors are interposed between the first redistribution layer and the external chip to interconnect the first redistribution layer and the external chip, and the conductive contact is extended from the second surface to the first surface of the substrate to electrically connect the device region.

20 Claims, 18 Drawing Sheets

(51) Int. Cl.
    *H01L 25/00*     (2006.01)
    *H01L 21/52*     (2006.01)
    *H01L 21/56*     (2006.01)
    *H01L 21/768*     (2006.01)
    *H01L 21/8234*     (2006.01)

(56) References Cited

FOREIGN PATENT DOCUMENTS

| | | |
|---|---|---|
| TW | 201440184 A | 10/2014 |
| TW | 201501247 A | 1/2015 |
| TW | I482257 B | 4/2015 |

\* cited by examiner

MULTI-DEVICE PACKAGE AND MANUFACTURING METHOD THEREOF

BACKGROUND

Description of Related Art

Along the evolution in the manufacturing technology of the semiconductor devices, the functional density of the semiconductor devices has increased with the decrease of device sizes to achieve higher integration density of the semiconductor devices. As a result, the demands to the packaging technology are becoming severe under the condition of decrease in size and increase in density of the semiconductor devices. In recent years, the demands to the smaller electronic devices have increased, and innovative packaging technology is required.

Generally, several devices are fabricated in a wafer, and a dicing process is performed to separate these devices into individual chips. These chips are placed on a carrier substrate, and a packaging process is performed to integrate multiple chips in one package. However, these chips suffer vibration when being placed on the carrier substrate, and problems of disconnection and fracture may easily occur on the chips, which decrease the yield of the package. In addition, extra costs for the carrier substrate further decrease efficiency of the packaging process. Therefore, a novel packaging structure and a manufacturing process thereof are necessary to solve problems mentioned above.

SUMMARY

The present disclosure provides a multi-device package. The multi-device package includes a substrate, at least two device regions, a first redistribution layer, an external chip, a plurality of first connectors and a conductive contact. The two device regions are formed from the substrate, and the substrate having a first surface and a second surface opposite to the first surface. The first redistribution layer is disposed on the first surface and electrically connected to the two device regions, and the external chip is disposed on the first redistribution layer. The first connectors are interposed between the first redistribution layer and the external chip to interconnect the first redistribution layer and the external chip, and the conductive contact is extended from the second surface to the first surface of the substrate to electrically connect the device region.

In various embodiments of the present disclosure, the multi-device package further includes a plurality of second connectors below the second surface, and each of the second connectors is in contact with the conductive contact.

In various embodiments of the present disclosure, the multi-device package further includes a molding layer covering the external chip and the first redistribution layer.

In various embodiments of the present disclosure, a diameter of the second connector is larger than a diameter of the first connector.

In various embodiments of the present disclosure, the first connectors and the second connectors are solder bumps or solder balls.

In various embodiments of the present disclosure, the multi-device package further includes a second redistribution layer and a plurality of second connectors. The second redistribution layer is disposed below the second surface, and the second connectors are disposed below the second redistribution layer.

In various embodiments of the present disclosure, each of the first redistribution layer and the second redistribution layer includes a dielectric layer, a plurality of metal layers and a plurality of vias. The metal layers are arranged in parallel inside the dielectric layer, and the two adjacent metal layers are electrically connected by the via.

In various embodiments of the present disclosure, the device region includes a semiconductor device, an inter-layer dielectric layer, an inter-metal dielectric layer and a metal interconnect structure. The inter-layer dielectric layer covers the semiconductor device, and the inter-metal dielectric layer is on the inter-layer dielectric layer. The metal interconnect structure is through the inter-metal dielectric layer and the inter-layer dielectric layer, and an uppermost metal layer of the metal interconnect structure acts as a conductive pad of the device region.

In various embodiments of the present disclosure, the conductive contact is in contact with the conductive pad of the device region.

In various embodiments of the present disclosure, the semiconductor device is a memory device.

The present disclosure provides a multi-device package. The multi-device package includes a substrate, at least two device regions, a first redistribution layer, an external chip, a second redistribution layer and a conductive contact. The two device regions are disposed in the substrate, and the first redistribution layer is disposed on the substrate. The external chip is disposed on the first redistribution layer, and the second redistribution layer is disposed below the substrate. The conductive contact is through the device region to interconnect the second redistribution layer and the device region.

The present disclosure provides a process of manufacturing a multi-device package, and the process includes following steps. A wafer having a first surface and a second surface opposite to the first surface is provided, and the wafer has at least two device regions therein. A first redistribution layer is formed on the first surface, which the first redistribution layer is electrically connected to the two device regions. Then, a plurality of first connectors is formed on the first redistribution layer; and an external chip is mounted on the first connectors, which the external chip is electrically connected to the first redistribution layer by the first connectors. A conductive contact is formed to extend from the second surface to the first surface, and the conductive contact is electrically connected to the device regions.

In various embodiments of the present disclosure, the process further includes following steps. A molding layer is formed to cover the external chip, and a temporary adhesive layer is formed on the molding layer. Then, the wafer is thinned, and the temporary adhesive layer is removed.

In various embodiments of the present disclosure, the process further includes following steps. A plurality of second connectors is formed below the second surface, and a diameter of the second connector is larger than a diameter of the first connector.

In various embodiments of the present disclosure, the process further includes dicing the wafer along a scribe line to form the multi-device package.

In various embodiments of the present disclosure, the conductive contact is formed to extend from the second surface to the first surface by following steps. A portion of the wafer is removed to form a through hole exposing a conductive pad of the device region, and a conductive material is filled in the through holes to form the conductive contact.

In various embodiments of the present disclosure, the process further includes following steps. A second redistribution layer is formed below the second surface, and the second redistribution layer is electrically connected to the conductive contact. Then, a plurality of second connectors is formed below the second redistribution layer.

In various embodiments of the present disclosure, the process further includes dicing the wafer along a scribe line to form the multi-device package.

In various embodiments of the present disclosure, the first redistribution layer is formed on the first surface by following steps. A dielectric material covering is deposited to cover the first surface, and a portion of the dielectric material is removed to form openings exposing the device regions of the wafer. Vias are formed in the openings, and a metal layer is formed on the vias. Then, the metal layer is patterned.

In various embodiments of the present disclosure, the second redistribution layer is formed below the second surface by following steps. A dielectric material covering is deposited to cover the second surface, and a portion of the dielectric material is removed to form openings exposing the conductive contact. Vias are formed in the openings, and a metal layer is formed below the vias. Then, the metal layer is patterned.

BRIEF DESCRIPTION OF THE DRAWINGS

The disclosure could be more fully understood by reading the following detailed description of the embodiment, with reference made to the accompanying drawings as follows.

DETAILED DESCRIPTION

Figure 1A:
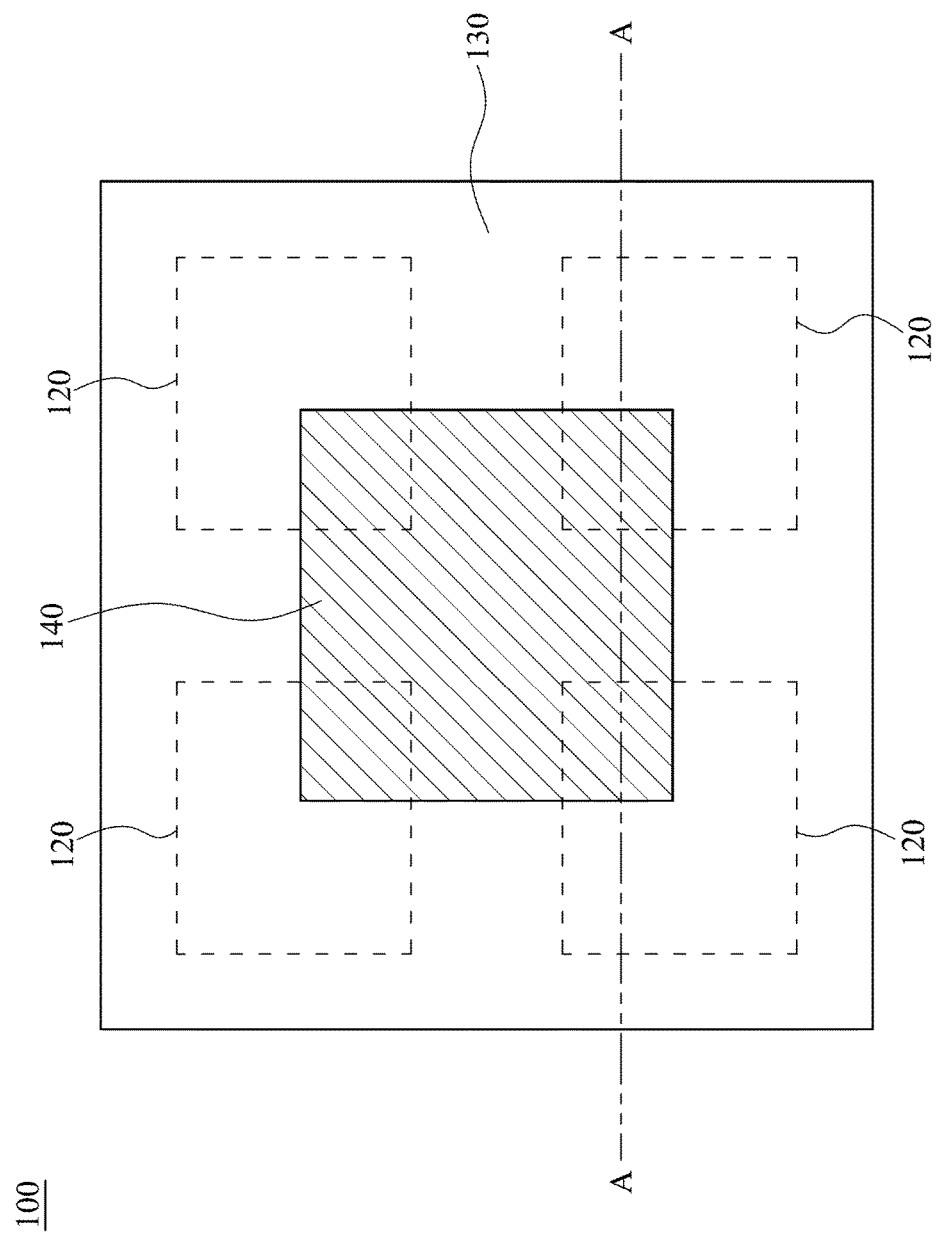
FIG. 1A is a top view of a multi-device package according to various embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Figure 1B:
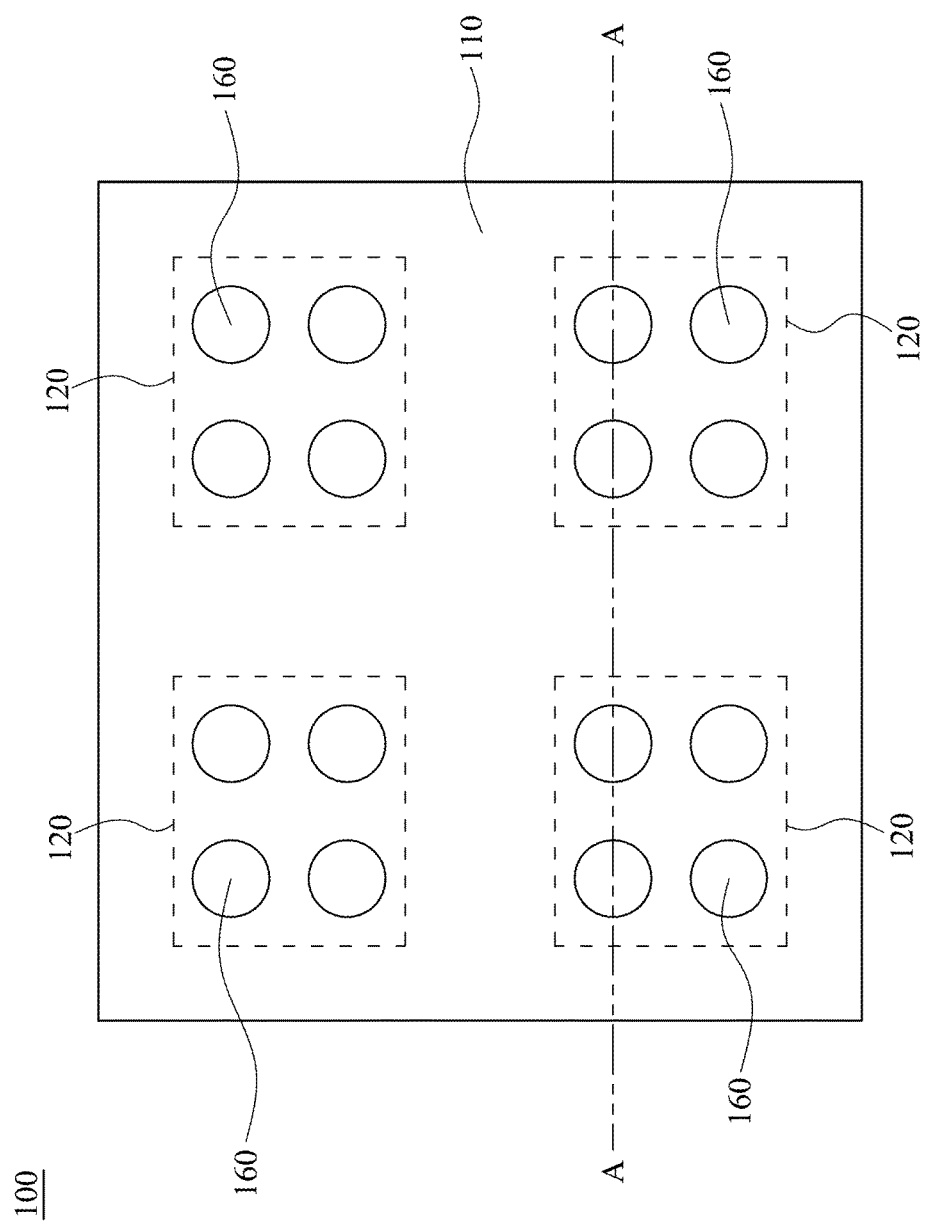
FIG. 1B is a bottom view of a multi-device package according to various embodiments of the present disclosure.
Figure 1C:
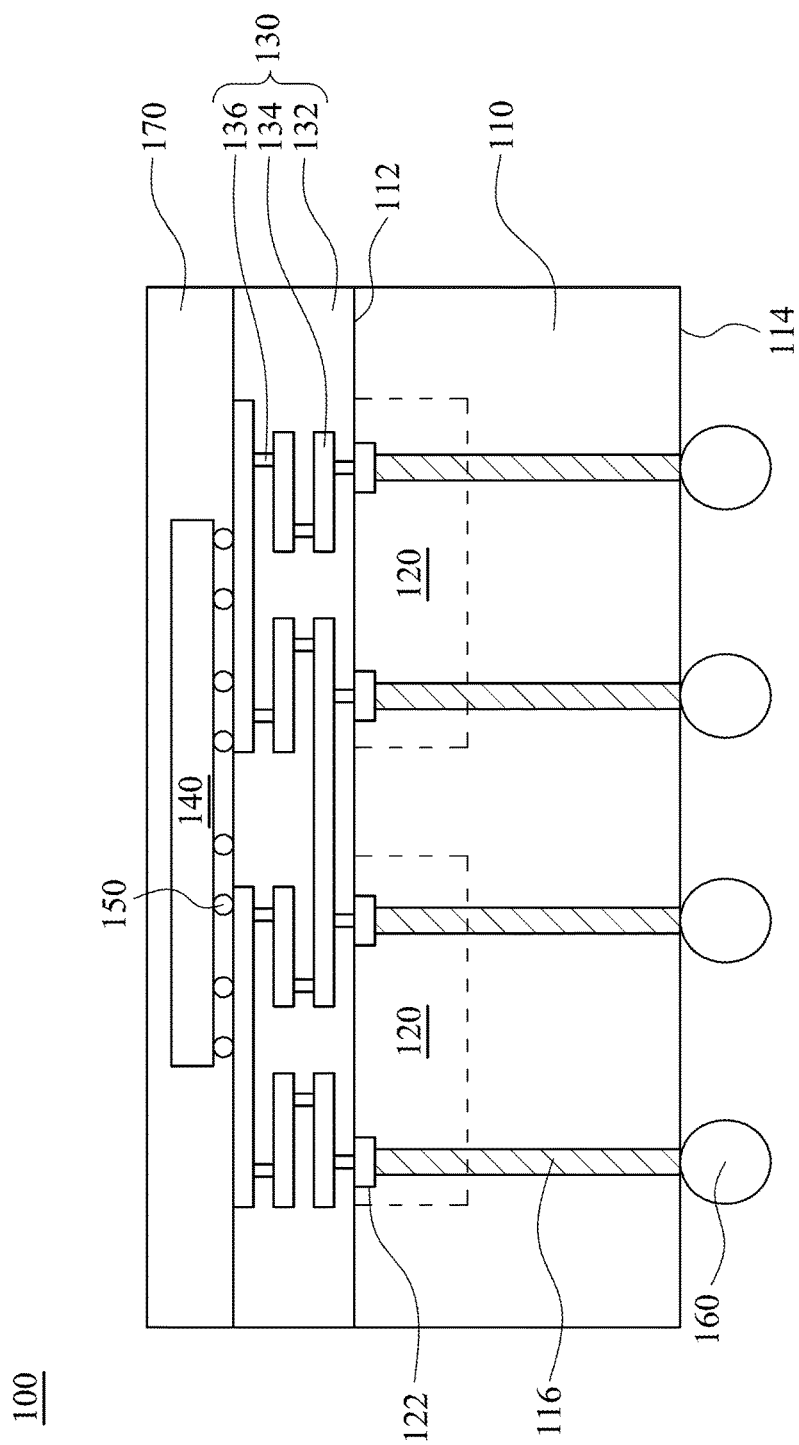
FIG. 1C is a cross-sectional view of the multi-device package in FIGS. 1A and 1B along the line AA, according to various embodiments of the present disclosure.

Please refer to FIG. 1A, FIG. 1B and FIG. 1C at the same time. FIG. 1A is a top view of a multi-device package according to various embodiments of the present disclosure, FIG. 1B is a bottom view of a multi-device package according to various embodiments of the present disclosure, and FIG. 1C is a cross-sectional view of the multi-device package in FIGS. 1A and 1B along the line AA, according to various embodiments of the present disclosure. As shown in FIG. 10, a multi-device package 100 includes a substrate 110, at least two device regions 120, a first redistribution layer 130, an external chip 140, a plurality of first connectors 150 and a plurality of second connectors 160. The substrate 110 includes a first surface 112 and a second surface 114, which the first surface 112 is opposite to the second surface 114.

These device regions 120 are formed from the substrate 110, so there is no interface between the device regions 120 and the substrate 110. Generally, a wafer is diced to separate device regions into individual chips. These chips are placed on a carrier substrate, and an interface is formed between the carrier substrate and the chips. Then, a packaging process is performed to integrate multiple chips in one package. However, these chips suffer vibration when being placed on the carrier substrate, and problems of disconnection and fracture may easily occur on the chips, which decrease the yield of the package. In addition, extra costs for the carrier substrate further decrease efficiency of the packaging process. Relatively, the multi-device package 100 of the present disclosure is manufactured by a wafer-level packaging process, which means all the device regions 120 are packaged and tested after completion of manufacturing these device regions 120 in the wafer, and then the wafer is diced into the multi-device package 100 shown in FIG. 1A to 1C. It is worth noting that the device regions 120 in the wafer are integrated directly before dicing to omit the usage of the carrier substrate, so that the device regions 120 and the substrate 110 have no interface therebetween.

Figure 1D:
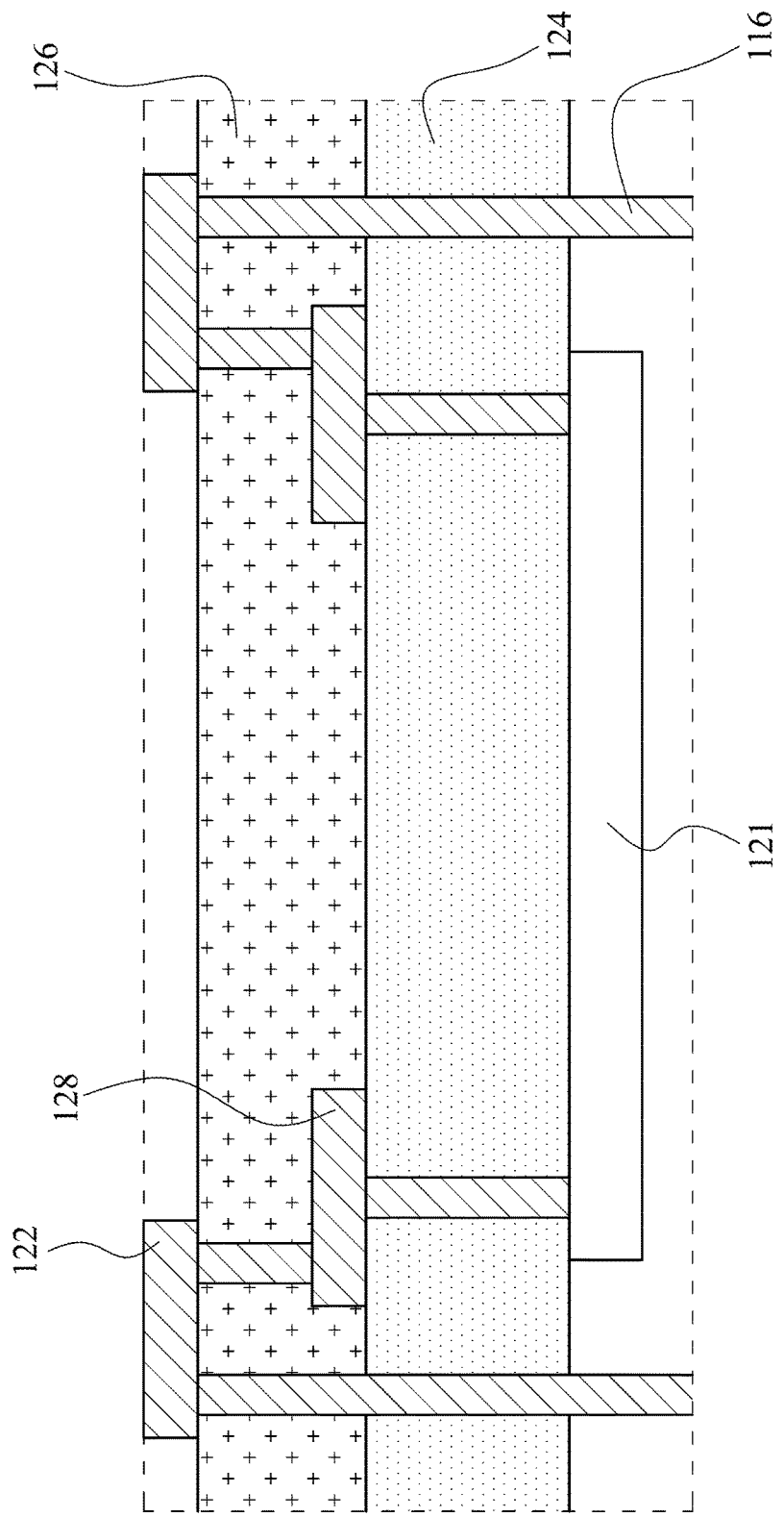
FIG. 1D is an enlarged view of the device region in the multi-device package.

Referring to FIG. 1D at the same time, FIG. 1D is an enlarged view of the device region 120 in the multi-device package. As shown in FIG. 1D, each of the device regions 120 includes a semiconductor device 121, an inter-layer dielectric (ILD) layer 124 covering the semiconductor device 121, an inter-metal dielectric (IMD) layer 126 on the ILD layer 124, and a metal interconnect structure 128 through the IMD layer 126 and the ILD layer 124 to electrically connect the semiconductor device 121. In addition, the device region 120 has a conductive pad 122, which is the uppermost metal layer of the metal interconnect structure 128. In some embodiments, the substrate 110 is formed from a wafer including silicon, germanium, or other III-V group elements, but not limited thereto. In various embodiments, the semiconductor device 121 is a memory device, but not limited thereto. Other semiconductor devices are also suitable in the present disclosure.

Continuing in FIG. 1C, the first redistribution layer 130 is disposed on the first surface 112 of the substrate 110 and electrically connected to at least two device regions 120. The first redistribution layer 130 is in contact with the conductive pads 122 of the device regions 120, so as the device regions 120 are electrically connected to each other by the first redistribution layer 130. Referring back to FIG. 1A, the multi-device package 100 illustrated in FIG. 1A has four device regions 120 therein, and the first redistribution layer 130 electrically connects these four device regions 120. For example, the semiconductor device 121 may be a memory device, and each of the device regions 120 provides a storage capacity of 2 gigabytes. The first redistribution 130 integrates these four device regions 120 to achieve a storage capacity of 8 gigabytes, but not limited thereto.

Furthermore, the first redistribution layer 130 is applied to redistribute or relocate the signals to an arrangement of external devices or input/output connections. The first redistribution layer 130 includes a dielectric layer 132, a plurality of metal layers 134 and a plurality of vias 136. These metal layers 134 are arranged in parallel inside the dielectric layer 132, and the vias 136 are also in the dielectric layer 132, which the two adjacent metal layers 134 are electrically connected by the via 136. To be noticed, the metal layers 134 are electrically connected to the conductive pads 122 of the device regions 120 by the vias 136, so as to electrically connect at least two device regions 120 through the conductive pads 122, the vias 136 and the metal layers 134. In addition, the number of the metal layers 136 is predetermined according to design requirement. In some embodiments, the vias 136 and the metal layers 134 are formed of aluminum, copper, or a combination thereof, but not limited thereto. Other conductive materials are also suitable for the vias 136 and the metal layers 134. In various embodiments, the dielectric layer 132 is formed of silicon oxide, silicon nitride, silicon oxynitride, or a combination thereof, but not limited thereto. Other insulating materials are also suitable for the dielectric layer 132.

Continuing in FIGS. 1A and 1C, the external chip 140 is disposed on the first redistribution layer 130, and a plurality of first connectors 150 are interposed between the first redistribution layer 130 and the external chip 140 to interconnect the two. As aforementioned, the first redistribution layer 130 is electrically connected to at least two device regions 120, and the first connectors 150 are disposed on and in contact with the first redistribution layer 130. The external chip 140 is disposed on and in contact with the first connectors 150, so that the external device 140 is electrically connected to the device regions 120 via the first connectors 150, the first redistribution layer 130 and the conductive pads 122. Therefore, the external chip 140 is able to receive the signals from the device regions 120 to perform computing operation.

In some embodiments, the multi-device package 100 further includes a molding layer 170 covering the first redistribution layer 130 and the external chip 140, so as to protect the external chip 140 and prevent warpage of the multi-device package 100. In various embodiments, the molding layer 170 may include epoxy.

Continuing in FIG. 1C, a conductive contact 116 is extended from the second surface 114 to the first surface 112 of the substrate 110 to electrically connect the device region 120. Specifically, the conductive contact 116 is in contact with the conductive pad 122 of the device region 120. Referring to FIG. 1D at the same time, the conductive contact 116 passes the ILD layer 124 and the IMD layer 126 to contact the conductive pad 122. To be noticed, the conductive contact 116 is not in contact with the semiconductor device 121 in the device region 120 to avoid connection errors. In some embodiments, the conductive contact 116 is in contact with one of the metal layer of the metal interconnect structure 128.

Continuing in FIGS. 1B and 1C, a plurality of second connectors 160 are disposed below the second surface 114 of the substrate 110, and each of the second connectors 160 is in contact with the conductive contact 116, so that the computing results generated by the external chip 140 is transmitted to the second connectors 160 by the first connectors 150, the first redistribution layer 130, the conductive pad 112 and the conductive contact 116. These second connectors 160 further transmit the computing results to other external devices, such as a printed circuit board. In some embodiments, a diameter of the second connector 160 is larger than a diameter of the first connector 150. In some embodiments, the first connectors 150 and the second connectors 160 may be solder bumps or solder balls formed of tin, but not limited thereto.

Figure 2A:
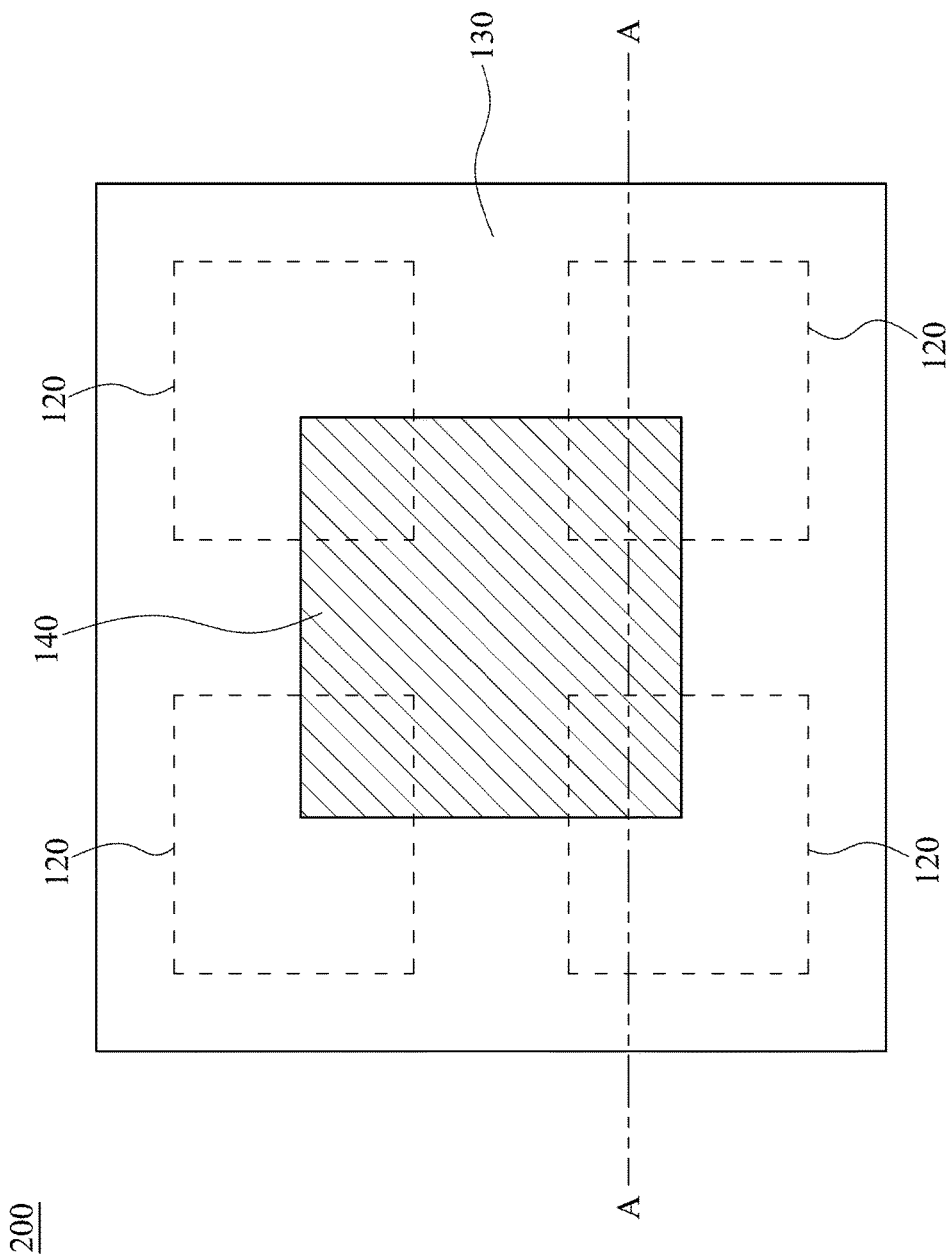
FIG. 2A is a top view of a multi-device package according to various embodiments of the present disclosure.
Figure 2B:
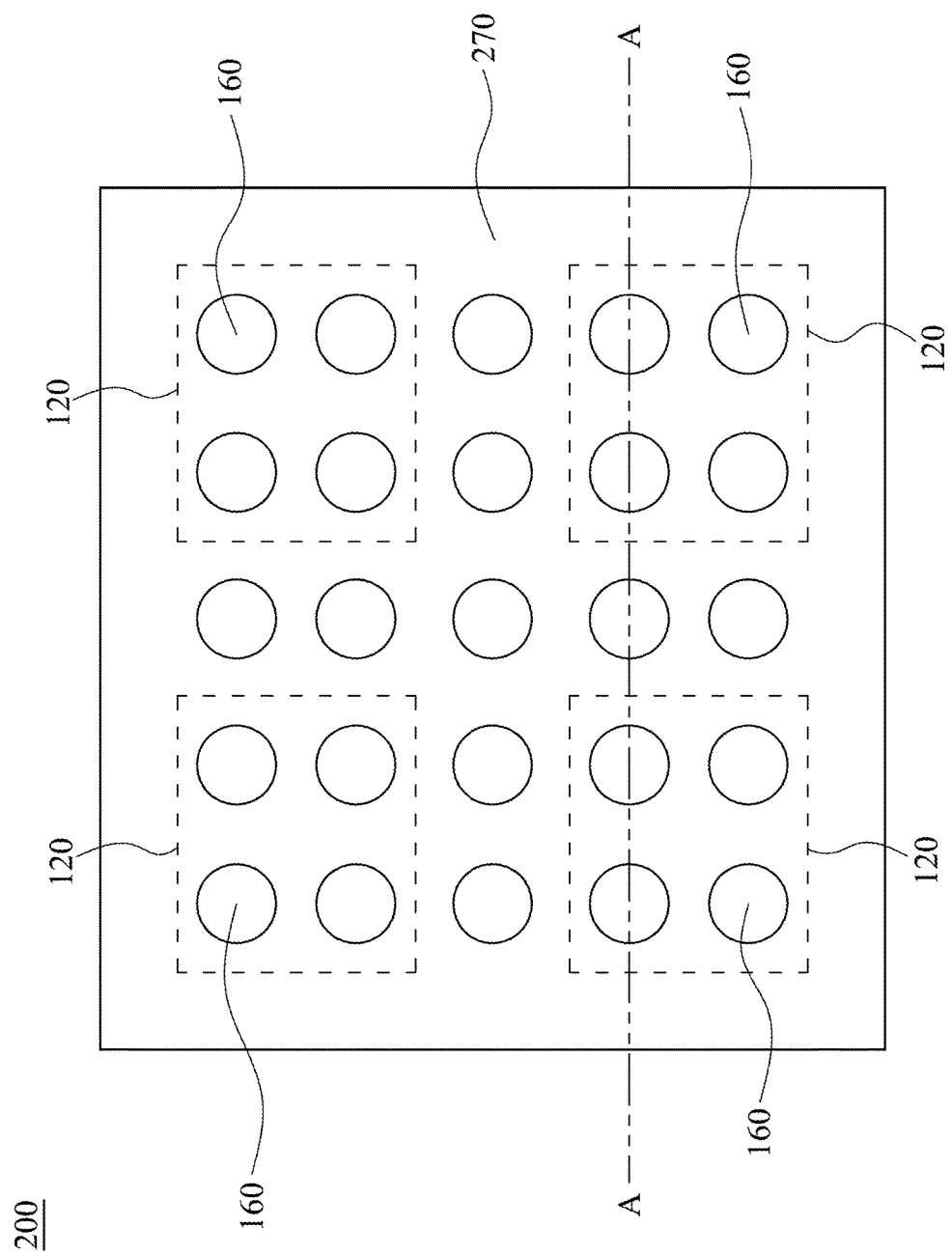
FIG. 2B is a bottom view of a multi-device package according to various embodiments of the present disclosure.
Figure 2C:
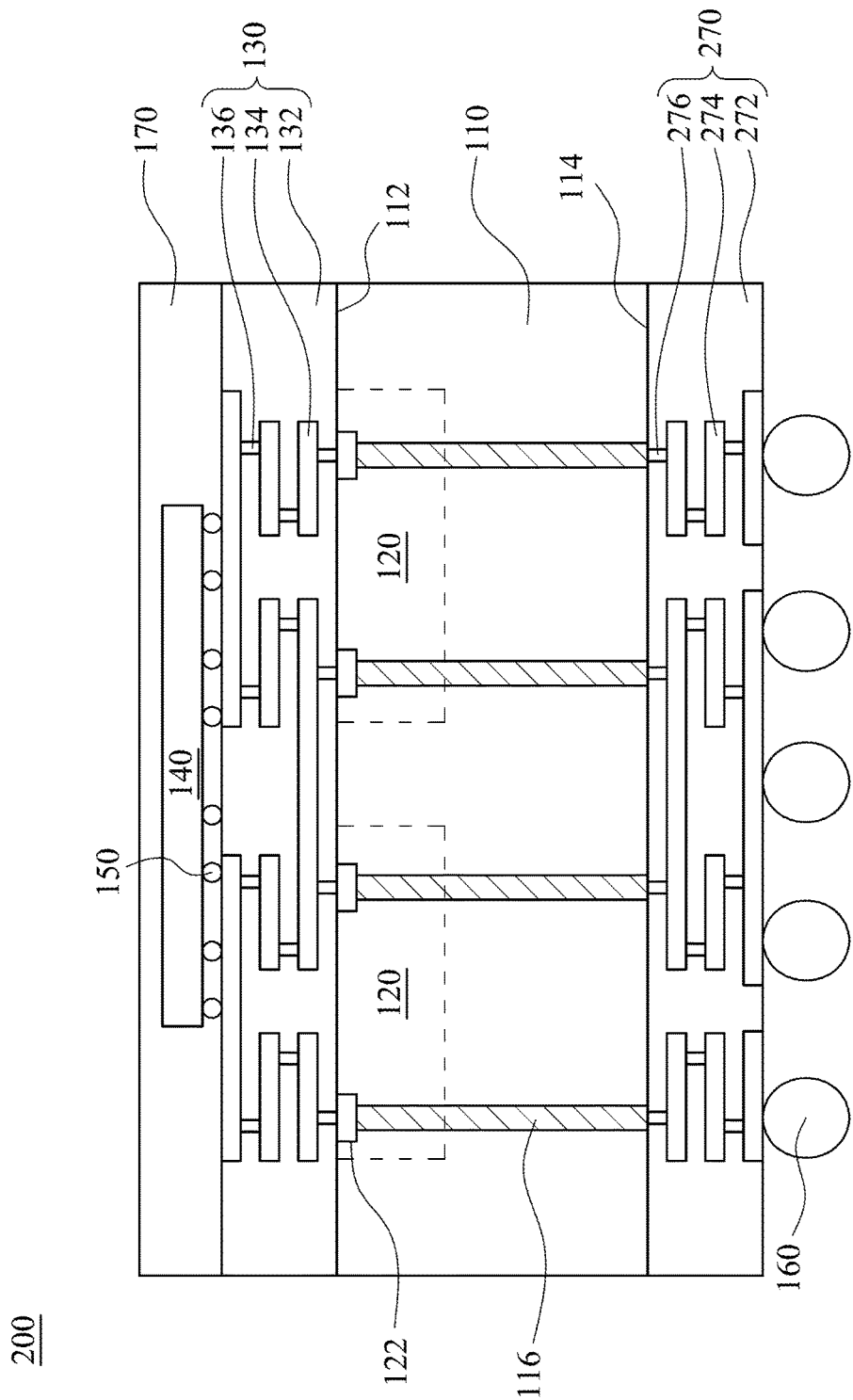
FIG. 2C is a cross-sectional view of the multi-device package in FIGS. 2A and 2B along the line AA, according to various embodiments of the present disclosure.

Referring to FIG. 2A, FIG. 2B and FIG. 2C at the same time. FIG. 2A is a top view of a multi-device package according to various embodiments of the present disclosure, FIG. 2B is a bottom view of a multi-device package according to various embodiments of the present disclosure, and FIG. 2C is a cross-sectional view of the multi-device package in FIGS. 2A and 2B along the line AA, according to various embodiments of the present disclosure. As shown in FIG. 2C, the difference between the multi-device package 100 and the multi-device package 200 is that the multi-device package 200 further includes a second redistribution layer 270 below the second surface 114, and the second connectors 160 is disposed below and in contact with the second redistribution layer 270.

The second redistribution layer 270 includes a dielectric layer 272, a plurality of metal layers 274 and a plurality of vias 276. These metal layers 274 are arranged in parallel inside the dielectric layer 272, and the vias 276 are also in the dielectric layer 272, which the two adjacent metal layers 274 are electrically connected by the via 276. To be noticed, the metal layers 274 are also electrically connected to the conductive contact 116 by the vias 276. In addition, the number of the metal layers 274 is predetermined according to design requirement. As aforementioned, the second connectors 160 are in contact with the second redistribution layer 270, so that the computing results generated by the external chip 140 is transmitted to the second connectors 160 via the first connectors 150, the first redistribution layer 130, the conductive pad 122, the conductive contact 116 and the second redistribution layer 270. These second connectors 160 further transmit the computing results to other external devices, such as a printed circuit board. Most importantly, layout of the second connectors 160 is more flexible due to the formation of the second redistribution layer 270.

Comparing FIG. 1C and FIG. 2C, a density of the second connectors 160 below the second surface 114 in the multi-device package 200 is larger than a density of the second connectors 160 below the second surface 114 in the multi-device package 100. Specifically, each of the second connectors 160 in the multi-device package 100 is corresponded to one conductive contact 116. Relatively, the redistribution layer 270 in the multi-device package 200 redistributes electrical paths, and thus enlarges the space for placing the second connectors 160 to increases its density. Therefore, the electrical connection between the multi-device package 200 and the printed circuit board is enhanced due to the higher density of the second connectors 160.

Refer to FIGS. 3A to 3E to further clarify a process of manufacturing the multi-device package 100 shown in FIG. 1A to 1C. FIGS. 3A to 3E are cross-sectional views of the multi-device package in FIG. 1C at an intermediate stage of fabrication, in accordance with various embodiments.

Figure 3A:
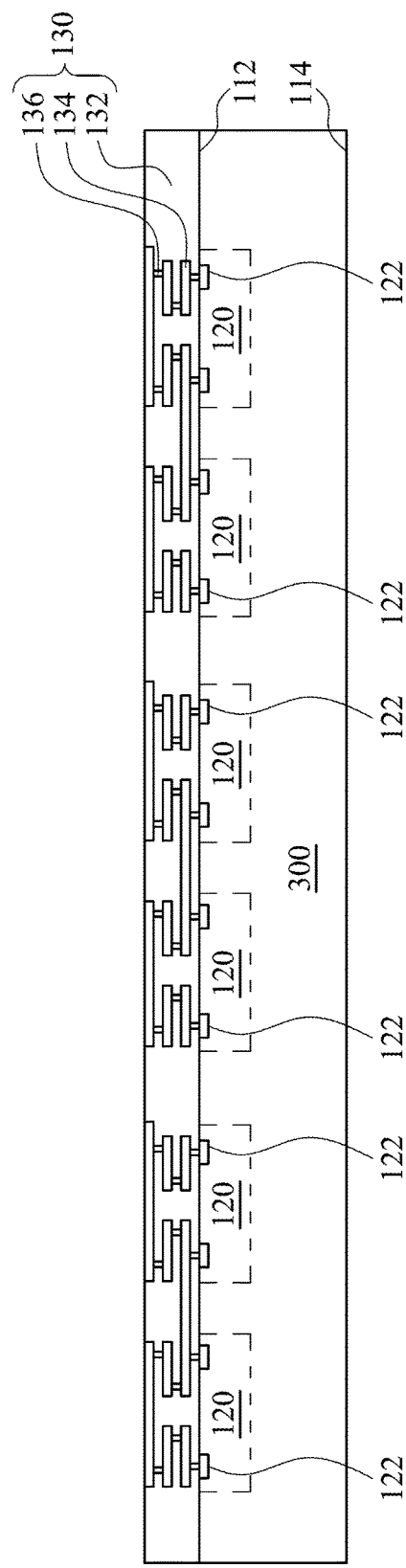
FIGS. 3A to 3E are cross-sectional views of the multi-device package in FIGS. 1A to 1C at an intermediate stage of fabrication, in accordance with various embodiments.

Referring to FIG. 3A, a wafer 300 having a first surface 112 and a second surface 114 opposite to the first surface 112 is provided, which the wafer 300 has at least two device regions 120 therein. Then, a first redistribution layer 130 is formed on the first surface 112, which the first redistribution layer 130 is electrically connected to the two device regions 120. As aforementioned in FIG. 1D, each of the device regions 120 includes a semiconductor device 121, an inter-layer dielectric (ILD) layer 124 covering the semiconductor device 121, an inter-metal dielectric (IMD) layer 126 on the ILD layer 124, and a metal interconnect structure 128 through the IMD layer 126 and the ILD layer 124 to electrically connect the semiconductor device 121. In addition, each of the device region 120 has a conductive pad 122, which is the uppermost metal layer of the metal interconnect structure 128. The first redistribution layer 130 is formed by following steps. First, a dielectric material is deposited to cover the first surface 112, and a photolithography etching process is performed to remove a portion of the dielectric material. Therefore, openings are formed to expose the device regions 120 of the wafer 300. Specifically, each of the openings is corresponded to one conductive pad 122 of the device regions 120. Then, vias 136 are respectively formed in these openings, and a metal layer 134 is formed on the vias 136. The metal layer 134 is patterned according to layout design, so as to electrically connect at least two device regions 120. The steps mentioned above are repeated few times to obtain the first redistribution layer 130 having a plurality of metal layers 136 inside a dielectric layer 132, and the number of the metal layers 136 is predetermined according to design requirement.

Figure 3B:
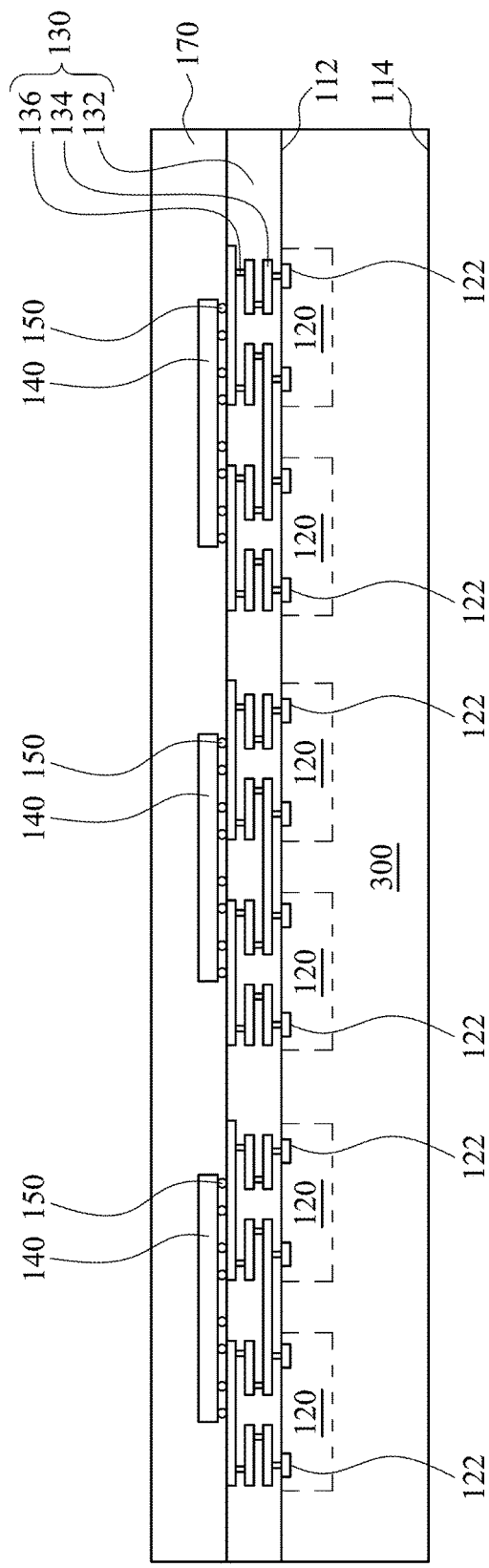

Referring to FIG. 3B, a plurality of first connectors 150 is formed on the first redistribution layer 130, and an external chip 140 is mounted on the first connectors 150. A reflow process is performed to form these first connectors 150 on the first redistribution layer 130, and the external chip 140 is formed to contact the first connectors 150. Thus, the external device 140 is electrically connected to the device regions 120 via the first connectors 150, the first redistribution layer 130 and the conductive pads 122, so the external chip 140 is able to receive the signals from the device regions 120 to perform computing operation. In addition, a molding layer 170 is further formed to cover the first redistribution layer 130 and the external chip 140, so as to protect the external chip 140 and prevent warpage of the wafer 300. In various embodiments, the molding layer 170 may include epoxy.

Figure 3C:
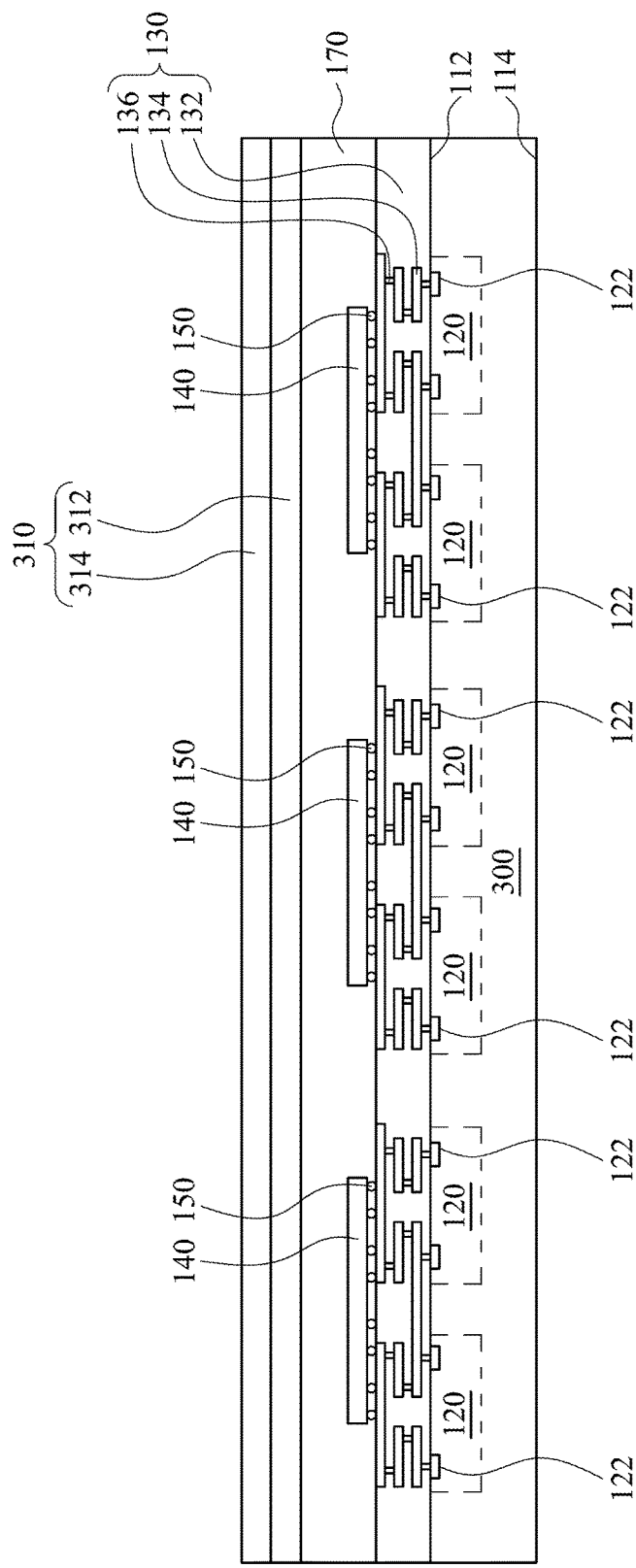

Continuing in FIG. 3C, a temporary adhesive layer 310 is formed on the molding layer 170, and the wafer 300 is thinned to reduce its thickness, so as to decrease the size of the subsequent multi-device package. The temporary adhesive layer 310 includes a carrier 314 and an adhesive layer 312, which the temporary adhesive layer 310 reduces the stress from the thinning process. Therefore, risk of wafer fracture is decreased. In some embodiments, the temporary adhesive layer 310 is a tape. In some embodiments, the wafer 300 is thinned by a chemical mechanical polishing process.

Figure 3D:
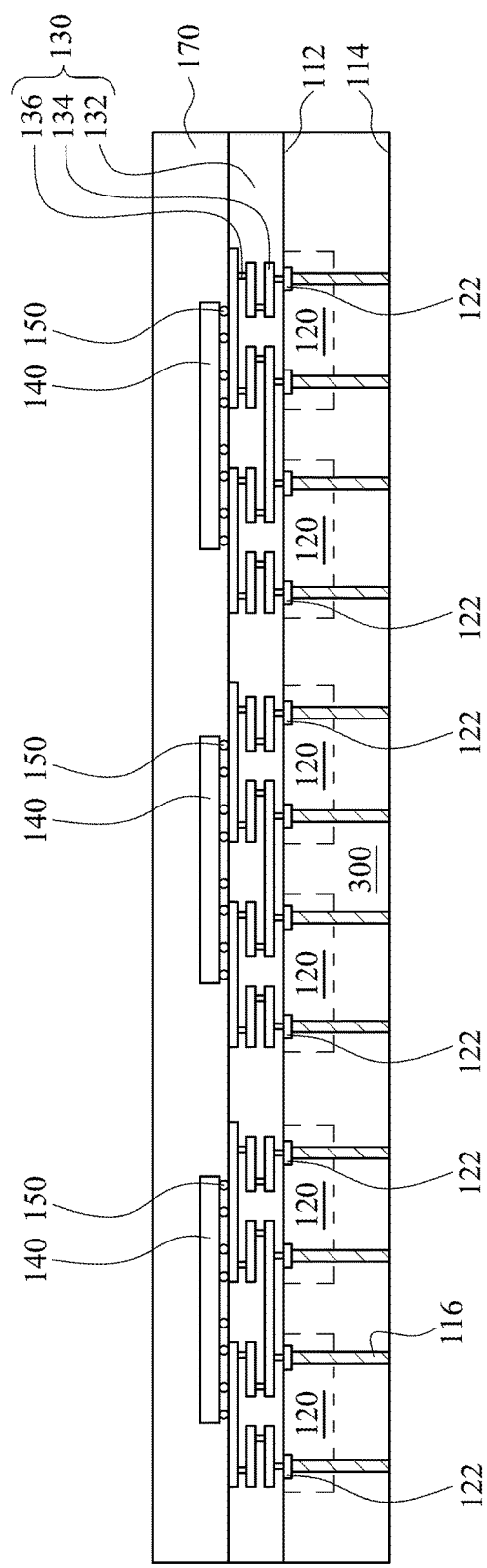

Continuing in FIG. 3D, a conductive contact 116 is formed to extend from the second surface 114 to the first surface 112, and the conductive contact 116 is electrically connected to the device region 120. Specifically, a portion of the wafer 300 is removed to form a through hole extending from the second surface 114 to the first surface 112, which the conductive pad 122 is exposed in the through hole. Then, a conductive material is filled in the through hole to form the conductive contact 116 electrically connecting to the conductive pad 122. In some embodiments, the portion of the wafer 300 is removed by a photolithography etching process to form the through hole. In various embodiments, the conductive contact 116 are formed of copper, aluminum, or a combination thereof, but not limited thereto. After forming the conductive contact 116, the temporary adhesive layer 310 is removed. A suitable solvent is applied to eliminate the adhesive property of the adhesive layer 312 to separate temporary adhesive layer 310 from the wafer 300. In some embodiments, the temporary adhesive layer 310 is removed before forming the conductive contact 116.

Figure 3E:
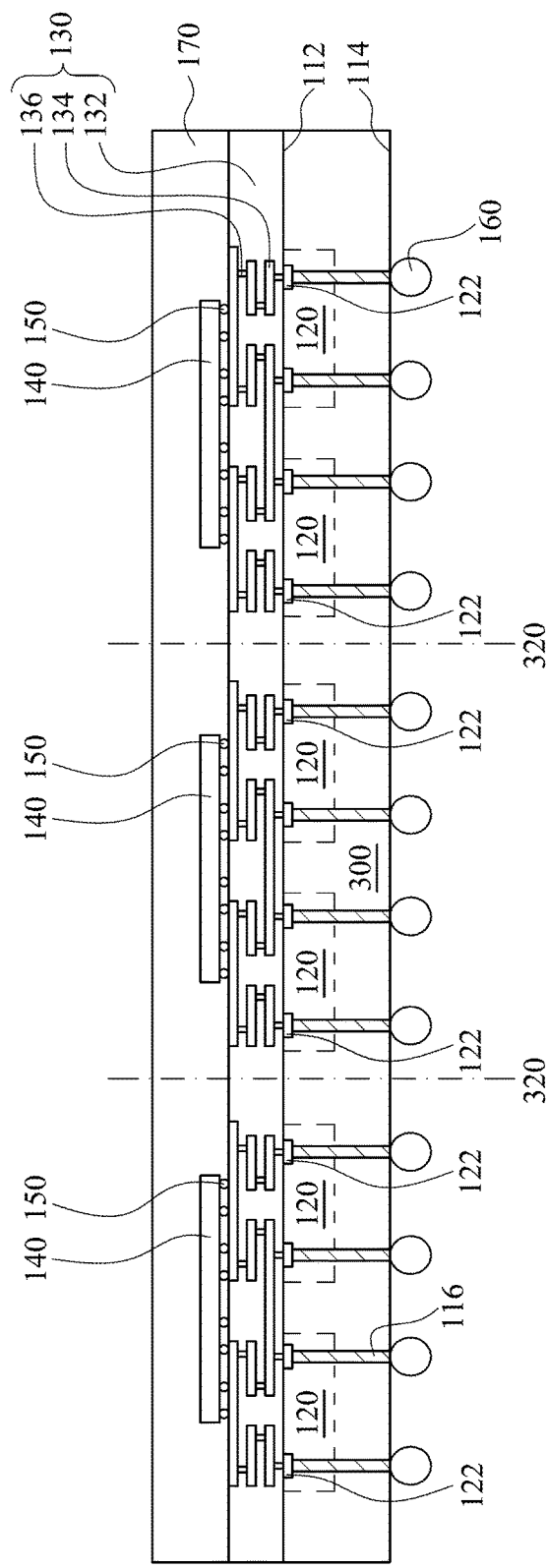

Referring to FIG. 3E, a plurality of second connectors 160 are formed below the second surface 114, and the wafer 300 is diced along a scribe line 320 to form the multi-device package shown 100 in FIG. 2A to 2C. A reflow process is performed to form these second connectors 160 below the second surface, and each of the second connectors 160 is in contact with one conductive contact 116. Then, the wafer 300 is diced along the scribe line 320 to form individual multi-device packages 100. To be noticed, the scribe line 320 does not pass the metal layers 134 of the first redistribution layer 130 to avoid the line disconnection of the first redistribution layer 130. In various embodiments, the multi-device package 100 is further connected to the printed circuit board by the second connectors 160, and the computing results generated by the external chip 140 is transmitted to the printed circuit board via the first connectors 150, the first redistribution layer 130, the conductive contact 116 and the second connectors 160.

Please refer to FIGS. 4A to 4F to further clarify another process of manufacturing the multi-device package 200 shown in FIGS. 2A to 2C. FIGS. 4A to 4F are cross-sectional views of the multi-device package in FIGS. 2A to 2C at an intermediate stage of fabrication, in accordance with various embodiments.

Figure 4A:
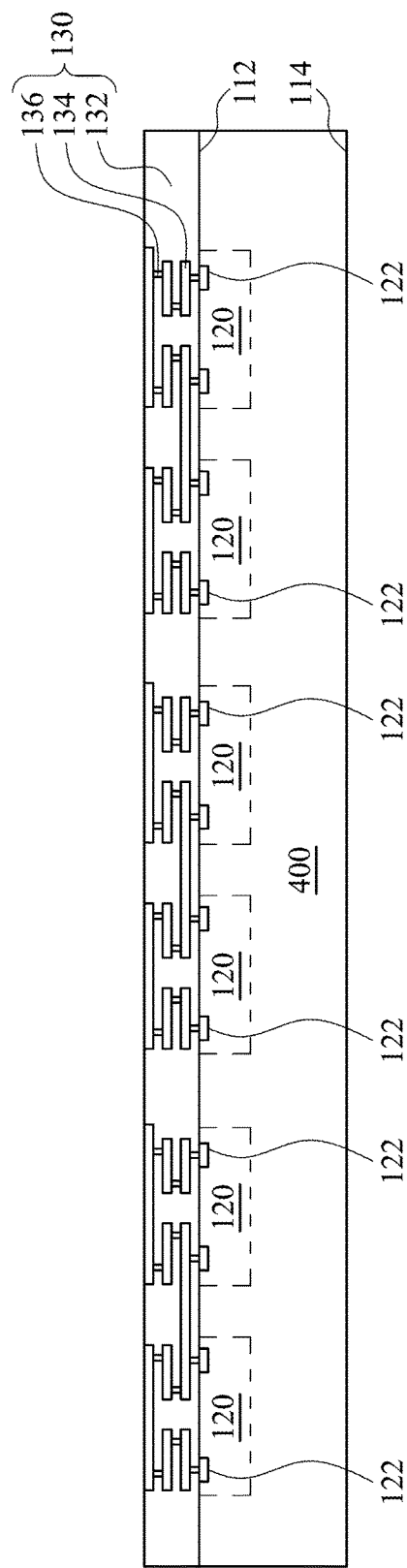
FIGS. 4A to 4F are cross-sectional views of the multi-device package in FIGS. 2A to 2C at an intermediate stage of fabrication, in accordance with various embodiments.

Referring to FIG. 4A, a wafer 400 having a first surface 112 and a second surface 114 opposite to the first surface 112 is provided, which the wafer 400 has at least two device regions 120 therein. Then, a first redistribution layer 130 is formed on the first surface 112, which the first redistribution layer 130 is electrically connected to the two device regions 120. As aforementioned in FIG. 1D, each of the device regions 120 includes a semiconductor device 121, an inter-layer dielectric (ILD) layer 124 covering the semiconductor device 121, an inter-metal dielectric (IMD) layer 126 on the ILD layer 124, and a metal interconnect structure 128 through the IMD layer 126 and the ILD layer 124 to electrically connect the semiconductor device 121. In addition, each of the device region 120 has a conductive pad 122, which is the uppermost metal layer of the metal interconnect structure 128. The steps of forming the first redistribution layer 230 is described in FIG. 3A, and the details are not described herein.

Figure 4B:
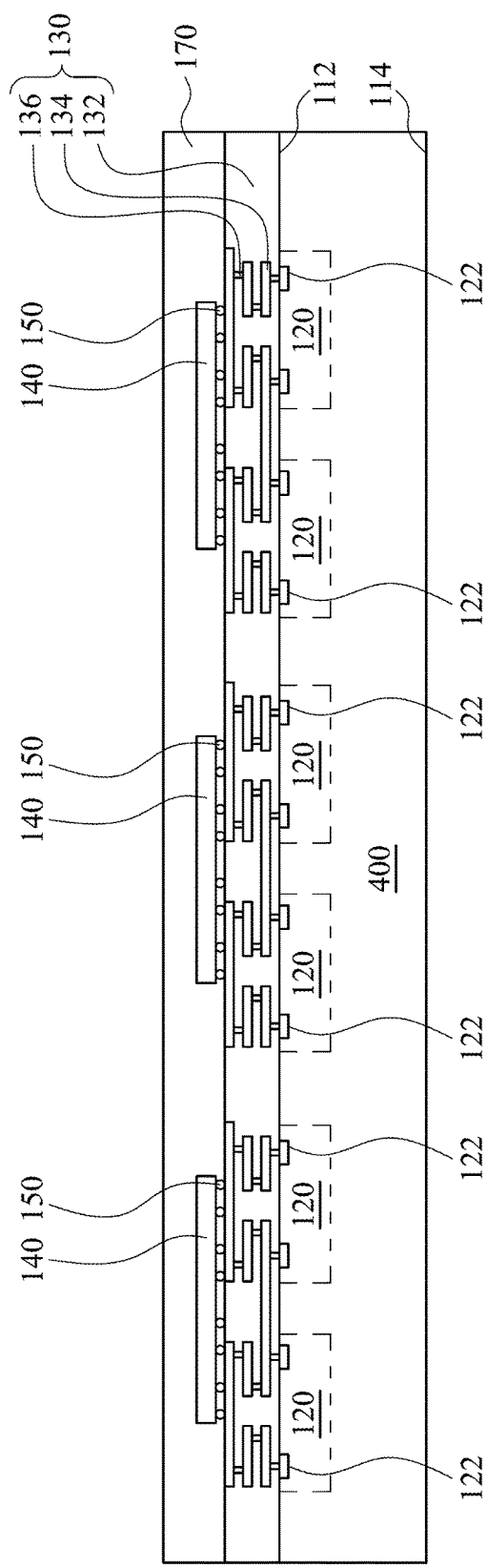

Referring to FIG. 4B, a plurality of first connectors 150 is formed on the first redistribution layer 130, and an external chip 140 is mounted on the first connectors 150. A reflow process is performed to form these first connectors 150 on the first redistribution layer 130, and the external chip 140 is formed to contact the first connectors 150. Thus, the external device 140 is electrically connected to the device regions 120 via the first connectors 150, the first redistribution layer 130 and the conductive pads 122, so the external chip 140 is able to receive the signals from the device regions 120 to perform computing operation. In addition, a molding layer 170 is further formed to cover the first redistribution layer 130 and the external chip 140, so as to protect the external chip 140 and prevent warpage of the wafer 400. In various embodiments, the molding layer 170 may include epoxy.

Figure 4C:
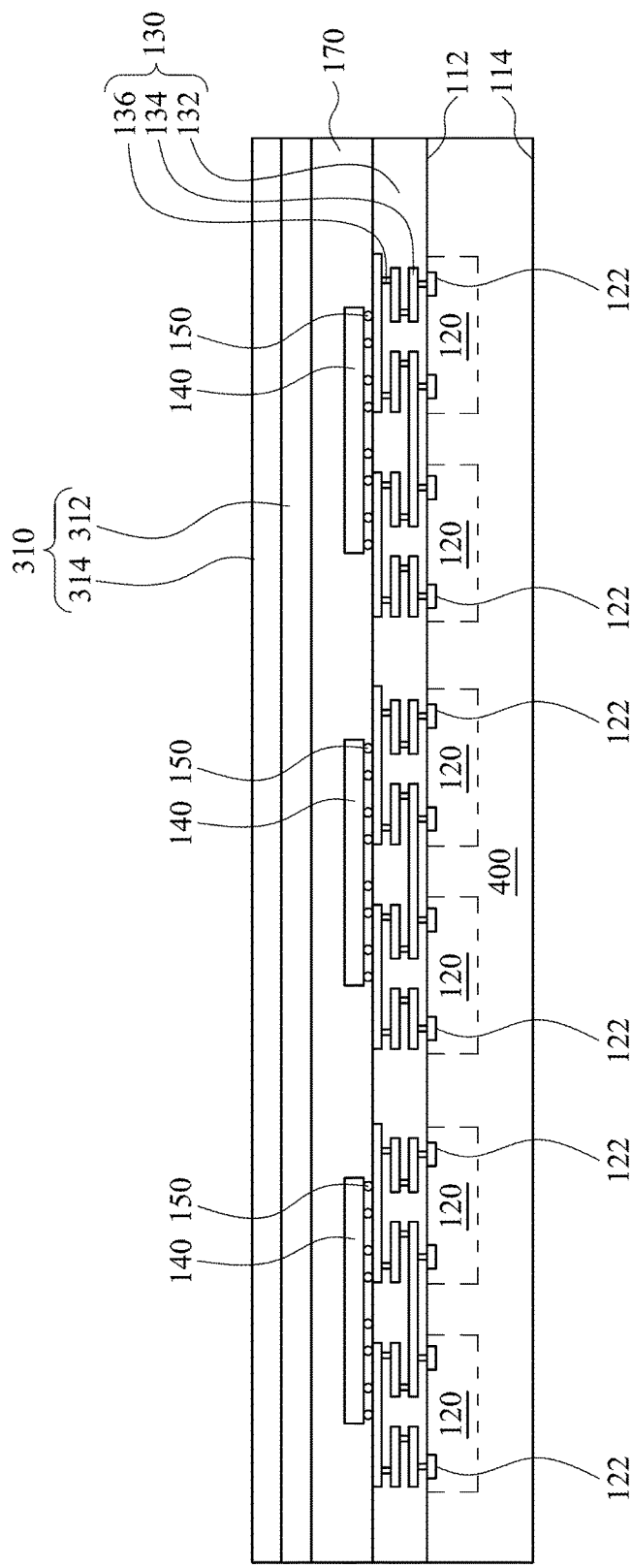

Continuing in FIG. 4C, a temporary adhesive layer 310 is formed on the molding layer 170, and the wafer 400 is thinned to reduce its thickness, so as to decrease the size of the subsequent multi-device package. The temporary adhesive layer 310 includes a carrier 314 and an adhesive layer 312, which the temporary adhesive layer 310 reduces the stress from the thinning process. Therefore, risk of wafer fracture is decreased. In some embodiments, the temporary adhesive layer 310 is a tape. In some embodiments, the wafer 400 is thinned by a chemical mechanical polishing process.

Figure 4D:
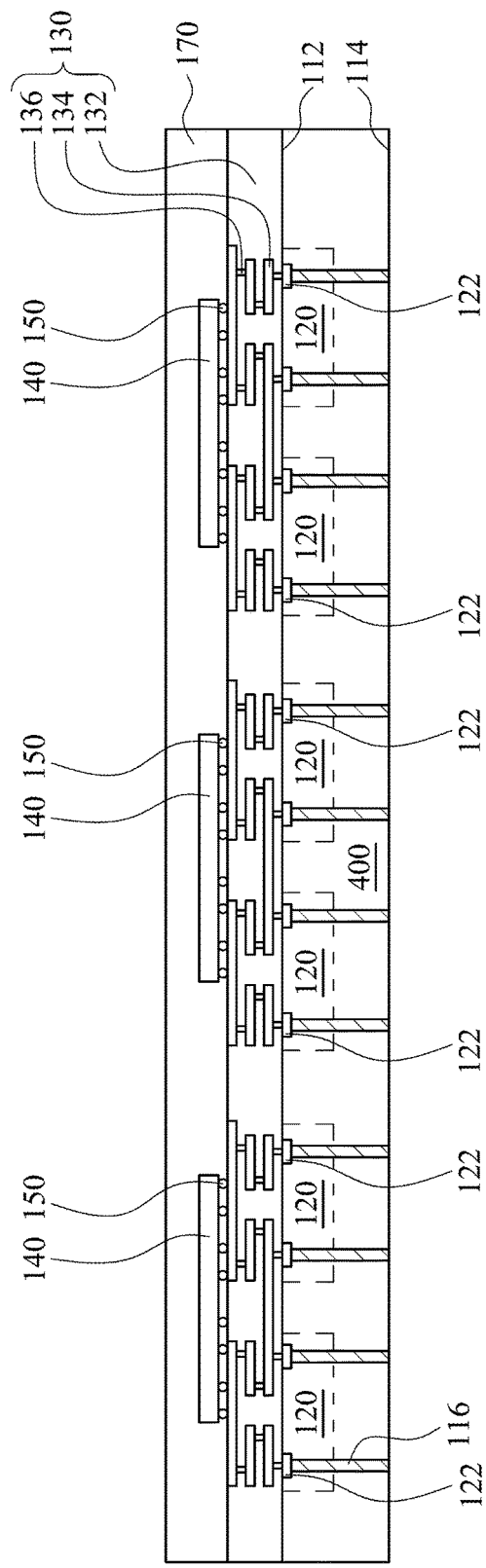

Referring to FIG. 4D, a conductive contact 116 is formed to extend from the second surface 114 to the first surface 112, and the conductive contact 116 is electrically connected to the device region 120. The steps of forming the conductive contact 116 is described in FIG. 3D, and the details are not described herein. After forming the conductive contact 116, the temporary adhesive layer 310 is removed. A suitable solvent is applied to eliminate the adhesive property of the adhesive layer 312 to separate temporary adhesive layer 310 from the wafer 400. In some embodiments, the temporary adhesive layer 310 is removed before forming the conductive contact 116.

Figure 4E:
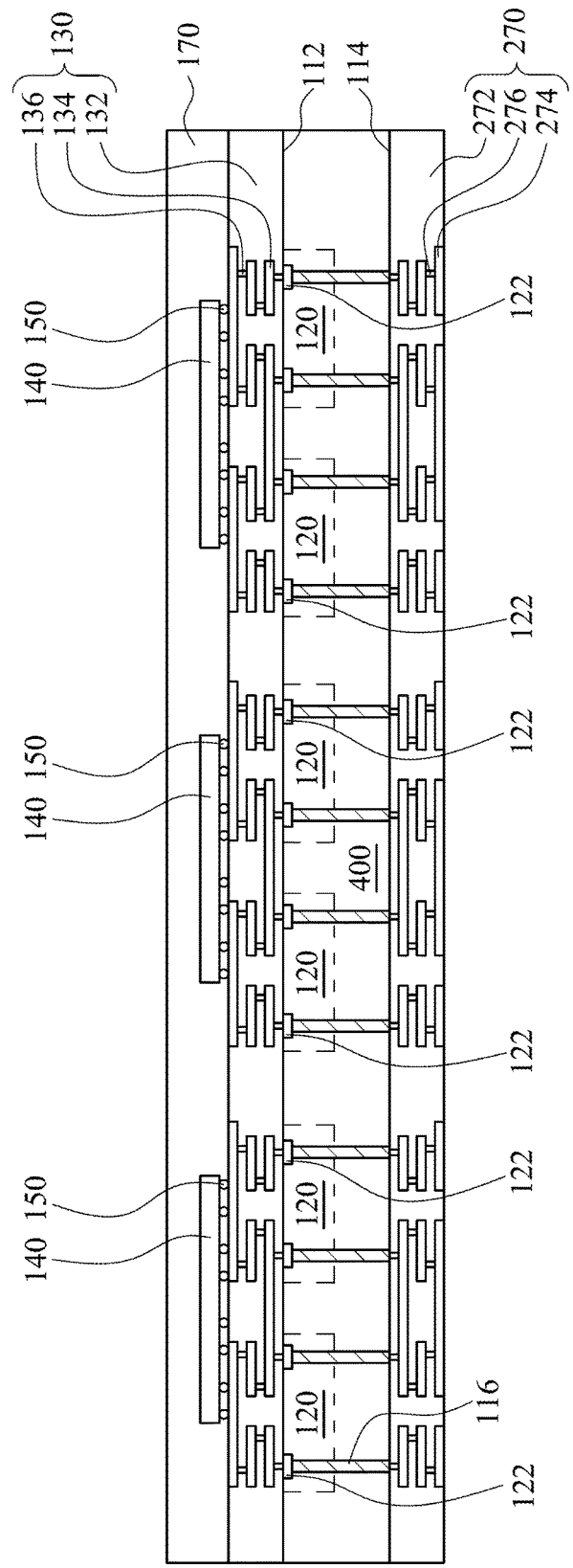

Referring to FIG. 4E, a second redistribution layer 270 is formed below the second surface 114. The second redistribution layer 270 is formed by following steps. First, a dielectric material is deposited to cover the second surface 114, and a photolithography etching process is performed to remove a portion of the dielectric material. Therefore, openings are formed, and each of the openings is corresponded to the conductive contact 116. Then, vias 276 are respectively formed in these openings, and a metal layer 274 is formed below the vias 276. The metal layer 274 is further patterned according to layout design. The steps mentioned above are repeated few times to obtain the second redistribution layer 270 having a plurality of metal layers 274 inside a dielectric layer 272, and the number of the metal layers 274 is predetermined according to design requirement.

Figure 4F:
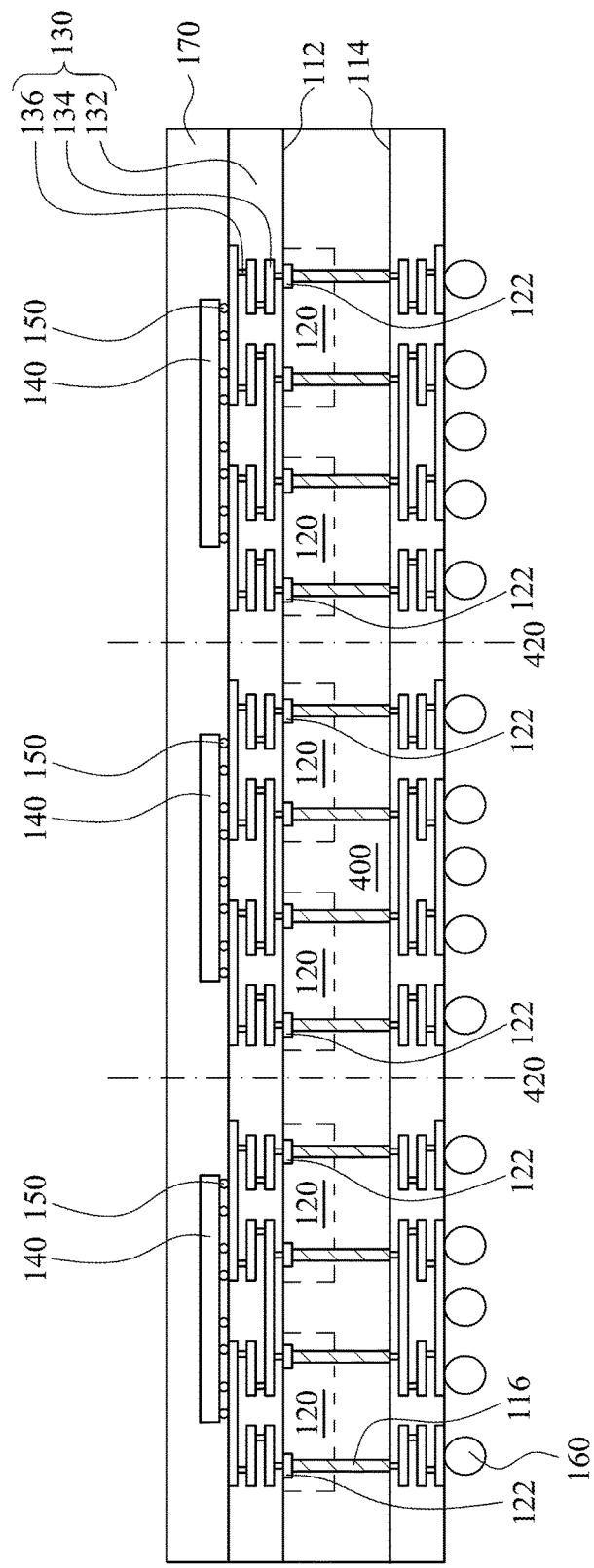

Continuing in FIG. 4F, a plurality of second connectors 160 is formed below the second redistribution layer 270, and the wafer 400 is diced along a scribe line 420 to form the multi-device package 200 shown in FIGS. 2A to 2C. A reflow process is performed to form these second connectors 160 below the second redistribution layer 270, and each of the second connectors 160 is in contact with the metal layer 274 of the second redistribution layer 270. Then, the wafer 400 is diced along the scribe line 420 to form individual multi-device packages 200. To be noticed, the scribe line 420 does not pass the metal layers 134 of the first redistribution layer 130 and the metal layers 274 of the second redistribution layer 270 to avoid the line disconnection. In various embodiments, the multi-device package 200 is further connected to the printed circuit board by the second connectors 160, and the computing results generated by the external chip 140 is transmitted to the printed circuit board via the first connectors 150, the first redistribution layer 130, the conductive contact 116, the second redistribution layer 270 and the second connectors 160.

The embodiments of the present disclosure discussed above have advantages over existing package and processes, and the advantages are summarized below. The present disclosure provides a wafer-level packaging process, which is applied to integrate at least two device regions in one multi-device package without using a carrier substrate, and therefore the substrate and the device regions of the multi-device package have no interface therebetween. Furthermore, the device regions in the wafer are integrated directly, so as to decrease risk of disconnection and fracture in the device regions. Summarize above points, the costs of the multi-device package is decreased due to a omission of the carrier substrate, and the efficiency of the packaging process is increased to enhance the yield of the multi-device package.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A multi-device package, comprising:
   at least two device regions formed from a substrate, and the substrate having a first surface and a second surface opposite to the first surface;
   a first redistribution layer disposed on the first surface and electrically connected to the two device regions;
   an external chip disposed on the first redistribution layer and at least electrically connected to the two device regions by the first redistribution layer;
   a plurality of first connectors interposed between the first redistribution layer and the external chip to interconnect the two; and
   a conductive contact extending from the second surface to the first surface of the substrate to electrically connect the device region.

2. The multi-device package of claim 1, further comprising a plurality of second connectors below the second surface, and each of the second connectors being in contact with the conductive contact.

3. The multi-device package of claim 2, wherein a diameter of the second connector is larger than a diameter of the first connector.

4. The multi-device package of claim 2, wherein the first connectors and the second connectors are solder bumps or solder balls.

5. The multi-device package of claim 1, further comprising a molding layer covering the external chip and the first redistribution layer.

6. The multi-device package of claim 1, further comprising:
   a second redistribution layer disposed below the second surface; and
   a plurality of second connectors disposed below the second redistribution layer.

7. The multi-device package of claim 6, wherein each of the first redistribution layer and the second redistribution layer comprises:
   a plurality of metal layers arranged in parallel inside a dielectric layer; and
   a plurality of vias, and the two adjacent metal layers being electrically connected by the via.

8. The multi-device package of claim 1, wherein the device region comprises:
   a semiconductor device;
   an inter-layer dielectric layer covering the semiconductor device;
   an inter-metal dielectric layer on the inter-layer dielectric layer; and
   a metal interconnect structure through the inter-metal dielectric layer and the inter-layer dielectric layer, and an uppermost metal layer of the metal interconnect structure acting as a conductive pad of the device region.

9. The multi-device package of claim 8, wherein the conductive contact is in contact with the conductive pad of the device region.

10. The multi-device package of claim 8, wherein the semiconductor device is a memory device.

11. A multi-device package, comprising:
at least two device regions disposed in a substrate;
a first redistribution layer disposed on the substrate;
an external chip disposed on the first redistribution layer and at least electrically connected to the two device regions by the first redistribution layer;
a second redistribution layer disposed below the substrate; and
a conductive contact through the device region to interconnect the second redistribution layer and the device region.

12. A process of manufacturing a multi-device package, comprising:
providing a wafer having a first surface and a second surface opposite to the first surface, and the wafer having at least two device regions therein;
forming a first redistribution layer on the first surface, and the first redistribution layer being electrically connected to the two device regions;
forming a plurality of first connectors on the first redistribution layer;
mounting an external chip on the first connectors, and the external chip being at least electrically connected to the two device regions by the first redistribution layer and the first connectors; and
forming a conductive contact extending from the second surface to the first surface, and the conductive contact being electrically connected to the device regions.

13. The process of manufacturing the multi-device package of claim 12, further comprising:
forming a molding layer covering the external chip;
forming a temporary adhesive layer on the molding layer;
thinning the wafer; and
removing the temporary adhesive layer.

14. The process of manufacturing the multi-device package of claim 13, further comprising:
forming a plurality of second connectors below the second surface, and a diameter of the second connector being larger than a diameter of the first connector.

15. The process of manufacturing the multi-device package of claim 14, further comprising:
dicing the wafer along a scribe line to form the multi-device package.

16. The process of manufacturing the multi-device package of claim 13, further comprising:
forming a second redistribution layer below the second surface, and the second redistribution layer being electrically connected to the conductive contact; and
forming a plurality of second connectors below the second redistribution layer.

17. The process of manufacturing the multi-device package of claim 16, further comprising:
dicing the wafer along a scribe line to form the multi-device package.

18. The process of manufacturing the multi-device package of claim 16, wherein forming the second redistribution layer below the second surface comprises:
forming a dielectric material covering the second surface;
removing a portion of the dielectric material to form openings exposing the conductive contact;
forming vias in the openings;
forming a metal layer below the vias; and
patterning the metal layer.

19. The process of manufacturing the multi-device package of claim 12, wherein forming the conductive contact extending from the second surface to the first surface comprises:
removing a portion of the wafer to form a through hole exposing a conductive pad of the device region; and
filling a conductive material in the through holes to form the conductive contact.

20. The process of manufacturing the multi-device package of claim 12, wherein forming the first redistribution layer on the first surface comprises:
depositing a dielectric material covering the first surface;
removing a portion of the dielectric material to form openings exposing the device regions of the wafer;
forming vias in the openings;
forming a metal layer on the vias; and
patterning the metal layer.

* * * * *